United States Patent
Todorov et al.

(10) Patent No.: US 9,099,510 B2
(45) Date of Patent: Aug. 4, 2015

(54) WORKPIECE FLIPPING MECHANISM FOR SPACE-CONSTRAINED ENVIRONMENT

(71) Applicant: Genmark Automation, Inc., Milpitas, CA (US)

(72) Inventors: Alexander Todorov, Santa Clara, CA (US); Zlatko Manolov Sotirov, Santa Clara, CA (US)

(73) Assignee: Genmark Automation, Inc., Milpitas, CA (US)

( * ) Notice: Subject to any disclaimer, the term of this patent is extended or adjusted under 35 U.S.C. 154(b) by 141 days.

(21) Appl. No.: 13/844,420

(22) Filed: Mar. 15, 2013

(65) Prior Publication Data

US 2014/0271086 A1    Sep. 18, 2014

(51) Int. Cl.
*H01L 21/677*    (2006.01)
*H01L 21/687*    (2006.01)

(52) U.S. Cl.
CPC .... *H01L 21/67718* (2013.01); *H01L 21/68707* (2013.01); *Y10S 294/902* (2013.01)

(58) Field of Classification Search
USPC .......... 134/140, 148, 153; 414/754, 758, 762, 414/763, 764, 771, 776, 783, 935, 936; 901/6, 8
See application file for complete search history.

(56) References Cited

U.S. PATENT DOCUMENTS

| | | | | |
|---|---|---|---|---|
| 5,117,590 A * | 6/1992 | Kudo et al. | ...................... | 451/44 |
| 5,227,707 A * | 7/1993 | Mitomi et al. | ............. | 318/568.1 |
| 5,421,889 A * | 6/1995 | Pollock et al. | ................ | 118/719 |
| 5,686,143 A * | 11/1997 | Matsukawa et al. | .......... | 427/271 |
| 6,283,701 B1 | 9/2001 | Sundar et al. | | |
| 6,547,638 B2 * | 4/2003 | Okumura et al. | ................. | 451/5 |
| 6,742,701 B2 | 6/2004 | Furuno et al. | | |
| 6,874,515 B2 * | 4/2005 | Ishihara et al. | ............... | 134/140 |
| 6,918,735 B2 * | 7/2005 | Urban et al. | ................... | 414/729 |
| 7,063,600 B2 * | 6/2006 | Yoshida et al. | ................. | 451/67 |
| 7,270,510 B2 * | 9/2007 | Putzi | ........................ | 414/226.05 |
| 7,322,787 B2 * | 1/2008 | Hashimoto | ................... | 414/754 |
| 7,775,222 B2 * | 8/2010 | Choi | ............................ | 134/137 |
| 7,878,213 B2 * | 2/2011 | Mitsuyoshi | ................... | 134/133 |
| 7,926,441 B2 * | 4/2011 | Tsutsumi et al. | ............. | 118/300 |

OTHER PUBLICATIONS

International Search Report and Written Opinion for PCT/US2014/023953 dated Jul. 14, 2014.

* cited by examiner

*Primary Examiner* — Gregory Adams
(74) *Attorney, Agent, or Firm* — Nixon Peabody LLP

(57) ABSTRACT

In one embodiment, a flipping module operable to flip a workpiece delivered by a robot in a vacuum transfer chamber (VTC) includes a gripper disposed outside a working envelope of the robot in a parked position in a vacuum environment of the VTC, and an actuator operable to move the gripper from the parked position to a receiving position, and to rotate the gripper and workpiece to thereby flip the workpiece.

8 Claims, 8 Drawing Sheets

WORKPIECE FLIPPING MECHANISM FOR SPACE-CONSTRAINED ENVIRONMENT

TECHNICAL FIELD

The present disclosure relates generally to semiconductor processing, and more particularly, to robot handling of workpieces, such as wafers and substrates, in vacuum chambers.

BACKGROUND

FIG. 1 is a schematic diagram of a workpiece processing system 100 in which a workstation 102 is coupled to an equipment front-end module (EFEM) 104. Workpieces handled manually or by robots (not shown) in EFEM 104 are delivered to or from the workstation 102 for processing in the workstation. Examples of workpieces include semiconductor wafers of various diameters, and substrates such as flat-panel displays. A pair of load locks 106 serve as interfaces between the vacuum environment of the workstation 102 and the EFEM 104, which is at atmospheric pressure.

Workstation 102 includes a vacuum transfer chamber (VTC) 108 surrounded by one or more processing stations 110 coupled at bays 111 of the VTC. The vacuum transfer chamber 108 houses a workpiece handling robot 112 in a vacuum environment. Workpieces, such as semiconductor wafer 114, are transferred by workpiece handling robot 112 from the load locks 106, to the various processing stations 110, and then back to the load locks. Workpiece handling robot 112 is equipped with an end effector 116 that engages the workpieces for pickup and transport between the load locks 106 and the processing stations 110. Each processing station 110 performs a particular processing task, such as chemical vapor deposition (CVD), plasma deposition, and the like, on the workpiece delivered to it by workpiece handling robot 112. Workpiece handling robot 112 may be equipped with multiple end effectors (only one is shown), and these may be independently actuatable in any of multiple degrees of freedom. The end effector(s) define the distalmost link in an articulated multi-link arm 118 of the workpiece handling robot 112. The number of links can vary depending on robot design.

It may be desirable under some circumstances to rotate, or flip, the workpiece so that it can undergo processing on an opposite side thereof. To conduct such flipping, workstation 112 must be suitably equipped. For example, robot arm 118, and specifically end effector 116, can be provided with an additional motor to impart roll motion to implement the flipping, and suitable clearance can be provided in the vacuum transfer chamber 108 for the flipping motion of the workpiece-end effector combination. However, in semiconductor processing environments, and particularly in the highly controlled vacuum transfer chamber region, "real estate" is at a premium, and expanding the size of the vacuum transfer chamber to provide flipping clearance for the workpiece-end effector combination is expensive and wasteful. This is exacerbated by the need to provide the additional motor, which occupies additional valuable space, and adds complication, weight, cost, and contaminants.

An alternative approach that is conventionally utilized is the dedication of one of the bays 111 to the flipping operation, by docking a specialized flipping station 120 to the VTC 108. The flipping motion can still be performed by the workpiece handling robot 112, which would then have to be suitably equipped (additional motor, etc.), to the detriments discussed above; or the flipping motion can be performed by a specialized mechanism (not shown) disposed in the dedicated flipping station 120. While the latter approach would eliminate the need for a flipping motion-capable robot, it ties up one of the bays 111, which would be better utilized for actual processing and increased throughput.

OVERVIEW

As described herein, a flipping module operable to flip a workpiece delivered by a robot in a vacuum transfer chamber (VTC) includes a gripper disposed outside a working envelope of the robot in a parked position in a vacuum environment of the VTC, and an actuator operable to move the gripper from the parked position to a receiving position, and to rotate the gripper and workpiece to thereby flip the workpiece.

Also described herein is a VTC using such a flipping module. The VTC includes a wall defining a chamber operable to house a workpiece handling robot in a vacuum environment, and one or more bays for coupling the vacuum environment to associated processing stations.

Also described herein is a method for flipping a workpiece in a vacuum environment containing a wafer handling robot whose motions prescribe a working envelope in the vacuum environment. The method includes moving a gripper from a parked configuration clear of the working envelope to a receiving configuration, delivering the workpiece to the gripper in the receiving configuration, rotating the gripper to thereby flip the workpiece, and retrieving the flipped workpiece from the gripper

BRIEF DESCRIPTION OF THE DRAWINGS

The accompanying drawings, which are incorporated into and constitute a part of this specification, illustrate one or more examples of embodiments and, together with the description of example embodiments, serve to explain the principles and implementations of the embodiments.

In the drawings.

DESCRIPTION OF EXAMPLE EMBODIMENTS

Example embodiments are described herein in the context of a workpiece flipping mechanism for a space constrained environment. Those of ordinary skill in the art will realize that the following description is illustrative only and is not intended to be in any way limiting. Other embodiments will readily suggest themselves to such skilled persons having the benefit of this disclosure. Reference will now be made in detail to implementations of the example embodiments as illustrated in the accompanying drawings. The same reference indicators will be used to the extent possible throughout the drawings and the following description to refer to the same or like items.

In the interest of clarity, not all of the routine features of the implementations described herein are shown and described. It will, of course, be appreciated that in the development of any such actual implementation, numerous implementation-specific decisions must be made in order to achieve the developer's specific goals, such as compliance with application- and business-related constraints, and that these specific goals will vary from one implementation to another and from one developer to another. Moreover, it will be appreciated that such a development effort might be complex and time-consuming, but would nevertheless be a routine undertaking of engineering for those of ordinary skill in the art having the benefit of this disclosure.

In accordance with this disclosure, the components, process steps, and/or data structures described herein may be implemented using various types of operating systems, computing platforms, computer programs, and/or general purpose machines. In addition, those of ordinary skill in the art will recognize that devices of a less general purpose nature, such as hardwired devices, field programmable gate arrays (FPGAs), application specific integrated circuits (ASICs), or the like, may also be used without departing from the scope and spirit of the inventive concepts disclosed herein. Where a method comprising a series of process steps is implemented by a computer or a machine and those process steps can be stored as a series of instructions readable by the machine, they may be stored on a tangible medium such as a computer memory device (e.g., ROM (Read Only Memory), PROM (Programmable Read Only Memory), EEPROM (Electrically Erasable Programmable Read Only Memory), FLASH Memory, Jump Drive, and the like), magnetic storage medium (e.g., tape, magnetic disk drive, and the like), optical storage medium (e.g., CD-ROM, DVD-ROM, paper card, paper tape and the like) and other types of program memory.

Figure 1:
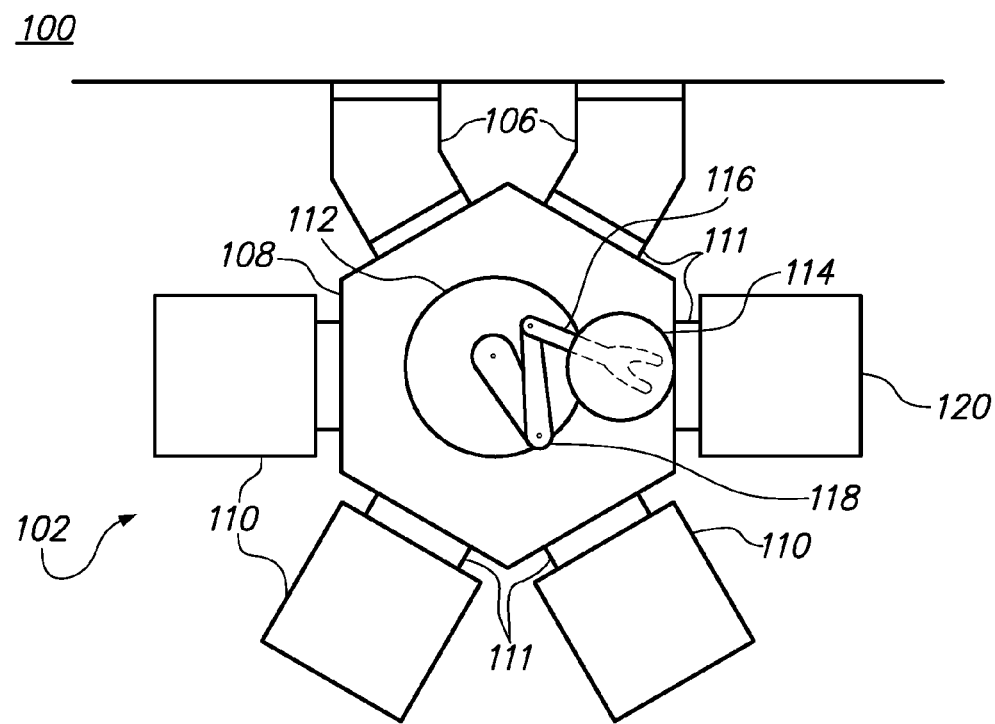
FIG. 1 is a schematic diagram of a conventional workpiece processing system in which a workstation is coupled to an equipment front-end module (EFEM).
Figure 2A:
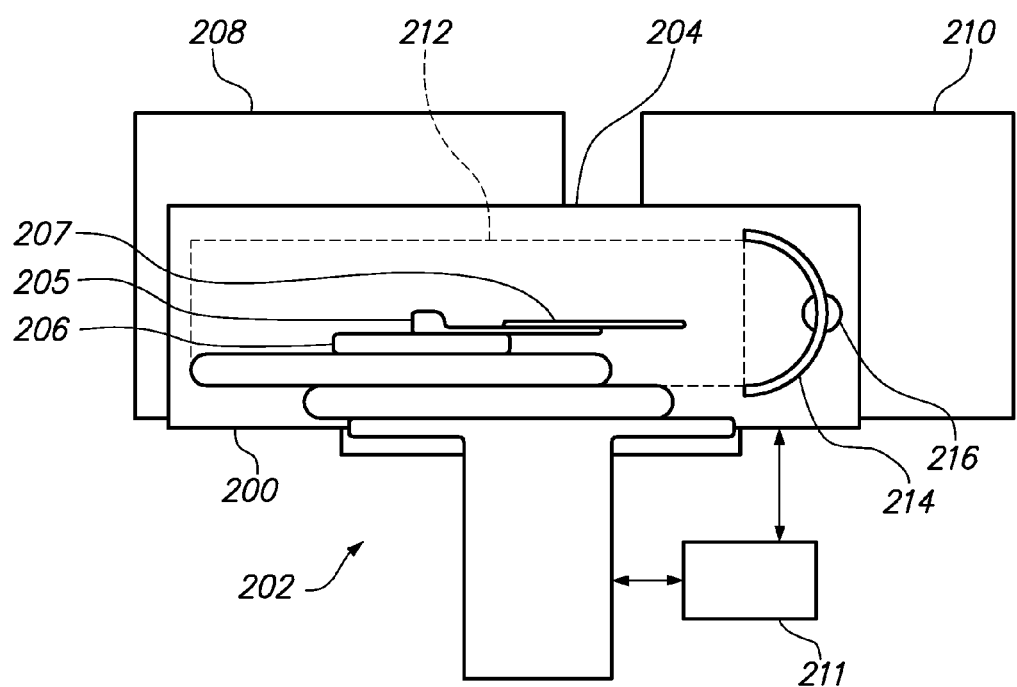
FIGS. 2A and 2B are diagrammatic elevational and plan views of portions of a vacuum transfer chamber (VTC) 200 in accordance with certain embodiments herein.
Figure 2B:
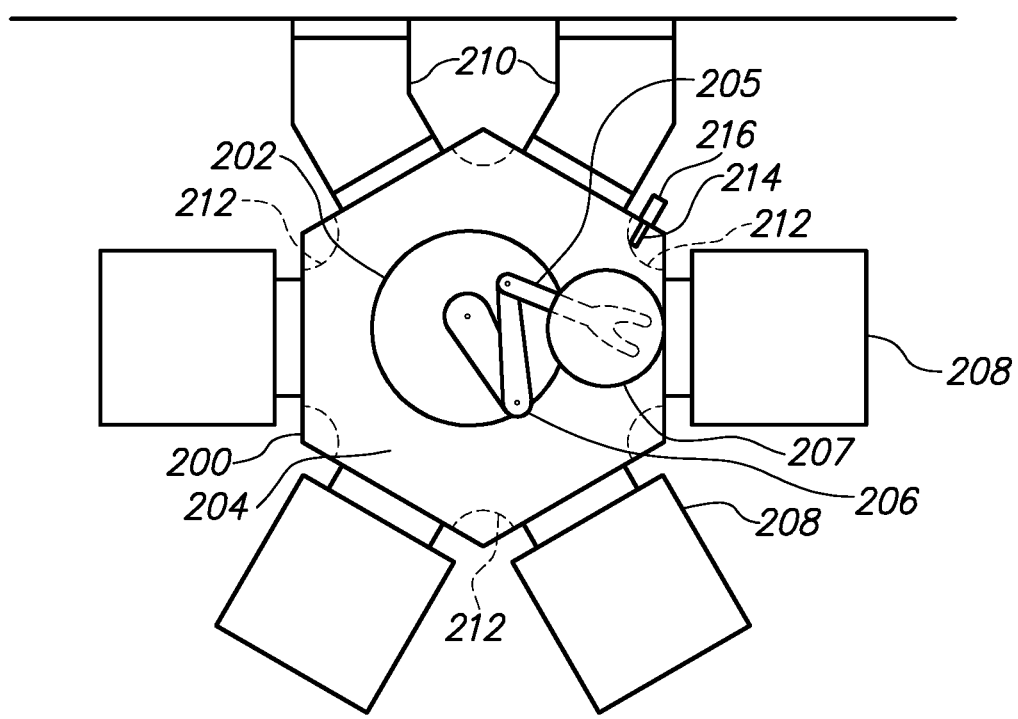

FIGS. 2A and 2B are diagrammatic elevational and plan views of portions of a vacuum transfer chamber (VTC) 200 in accordance with certain embodiments herein. VTC 200 houses a workpiece handling robot 202 at least partially disposed in a vacuum environment 204. End effector 205 of a robot arm 206 is shown carrying a workpiece, in this case a semiconductor wafer 207, for transport to and from various processing stations 208 and load locks 210 that are docked to the VTC. Robot motion is under the direction of a robot controller 211, which sends signals to the various robot components to implement the desired motion, and receives feedback to accurately control and coordinate the motion.

Robot arm 206 and transported wafer 207 prescribe a three-dimensional zone within a working envelope 212 (broken line) in VTC 200 during normal operation of the robot 202. At various times during their motions in VTC 200, at least a portion of one or both robot arm 206 and wafer 207 will pass through or obstruct points in the zone in working envelope 212.

Also disposed in VTC 200 is a gripper 214 of a flipping module 216. Gripper 214 is shown in a parked position, in which it is clear of the working envelope 212. Thus, during normal operation of robot 202, as the robot arm 206 moves within vacuum environment 204 and transports the workpiece to and from various processing stations 208 and load locks 210, gripper 214 is disposed in the parked configuration, remaining clear of the working envelope 212. In certain embodiments, such clearance is attained by the substantially vertical orientation of gripper 214 seen in FIG. 2, although this is not by way of limitation and other parked orientations that similarly clear a robot arm-workpiece motion zone are contemplated. In addition, the yoke shape of gripper 214 aids in achieving the clearance in the parked position, whereby portions of the yoke extend above and below the working envelope 212, although other shapes, depending on the contours of the working envelope, are contemplated. It should also be recognized that while for simplicity a simple box shape is illustrated for the working envelope 212, in typical applications more complex shapes would more accurately represent the working envelope.

Figure 3:
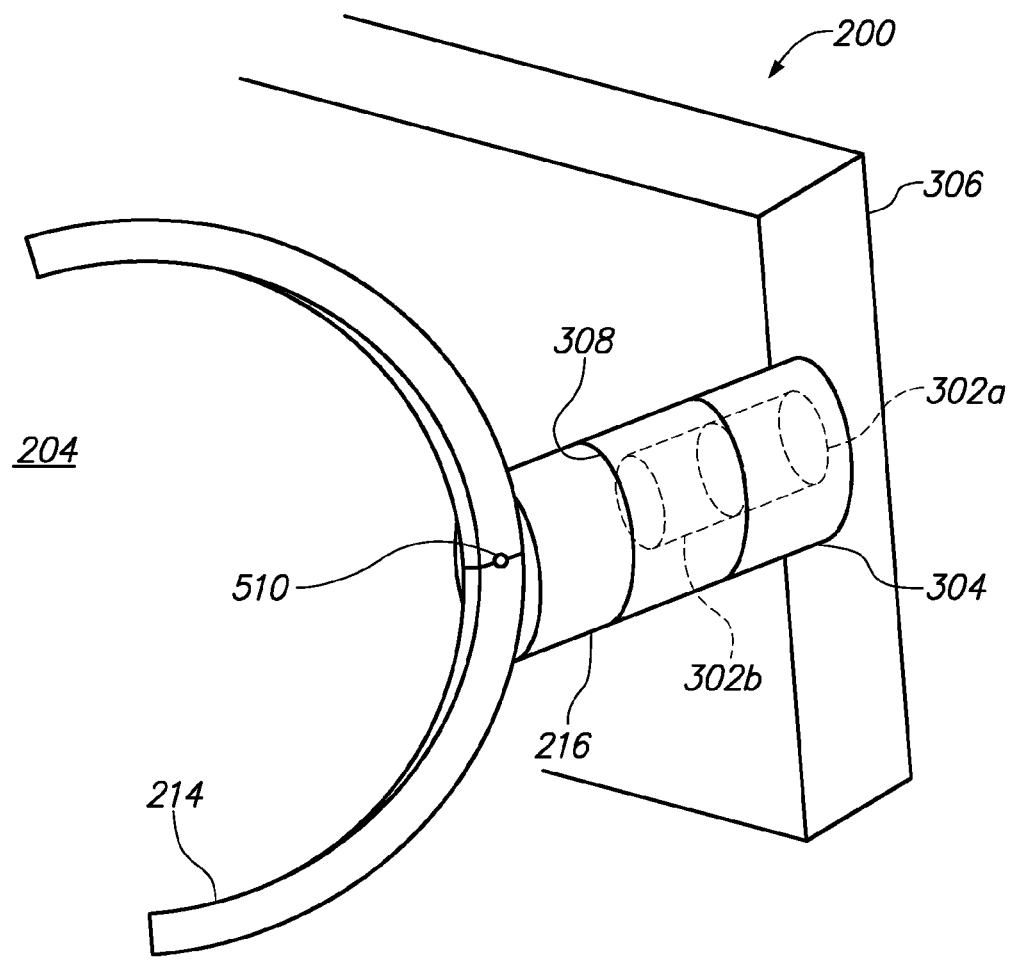
FIG. 3 is a perspective view of a flipping module in accordance with certain embodiments.

Gripper 214 is part of flipping module 216, shown in greater detail in FIG. 3. Flipping module 216 is mounted to VTC 200 and in certain embodiments is generally disposed with gripper 214 lying in the vacuum environment 204, and the remainder of the flipping module lying outside the vacuum environment. Actuators 302a, 302b (collectively 302) provide flipping module 216 with two degrees of freedom: the first to couple-decouple gripper 214 and the workpiece, and the other to rotate the gripper and flip the workpiece. In certain embodiments, the actuators 302, along with supporting electrical, mechanical and other components (not shown) are generally disposed in housing 304 and are retained outside VTC 200 to the extent possible, in order to minimize the amount of space that the flipping module 216 occupies within the vacuum environment 204. This is not by way of limitation, however, and in certain embodiments the majority or even all the flipping module components are disposed within vacuum environment 204 of VTC 200, such that the flipping module is mostly or entirely contained therein.

Returning to FIG. 3, the housing 304 penetrates through wall 306 of VTC 200, at hole 308, in a manner that preserves the integrity of the interior vacuum environment. A vacuum seal (not shown) can therefore be used for that purposes. Operation of the flipping module is under the control and direction of the controller 211.

Figure 4A:
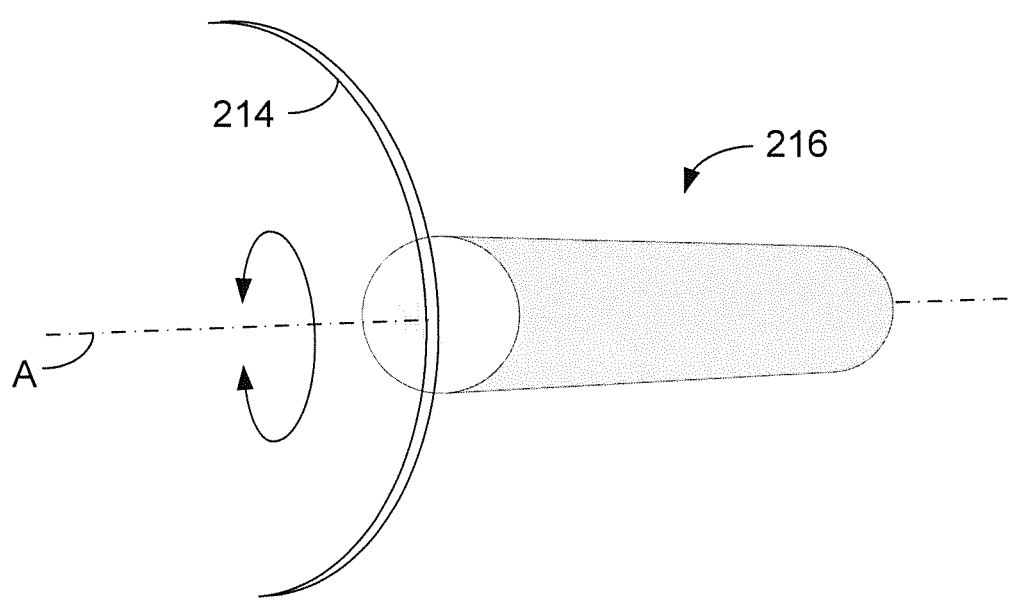
FIGS. 4A-4E are diagrammatic views showing a sequence of flipping module configurations associated with a flipping operation in accordance with certain embodiments herein.

During normal robot operation, gripper 214 rests empty in the parked position, substantially in a vertical plane, as shown in FIG. 4A. In the parked position, gripper 214 is outside the working envelope 212, and does not interfere with the motions of the robot arm 206 and transported workpiece.

Figure 4B:
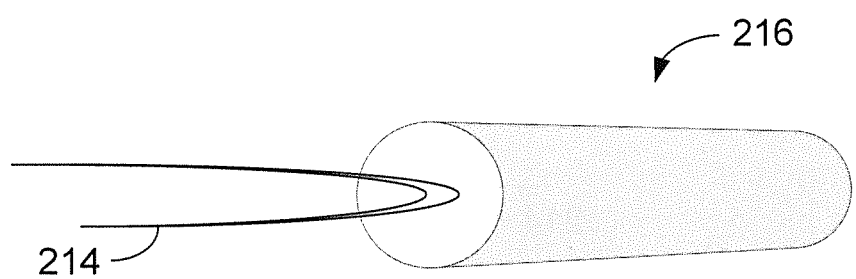

When the need to flip the workpiece arises, gripper 214 is brought to a workpiece receiving position, shown in FIG. 4B. To do this, controller 211 directs the actuator 302a to rotate the gripper 214 ninety degrees (or 270°), to lie substantially in a horizontal plane. The rotation is along the illustrated double-headed arrow, about axis A.

It may be that the receiving position, and the trajectory of the gripper 214 as it is rotated to the receiving position, overlap working envelope 212. Controller 211 can take measures to ensure that no collisions occur, either by parking the robot arm 206 and workpiece outside a working envelope of the gripper during gripper rotation, or by coordinating the motion of the robot arm/workpiece with the motion of the gripper 214 such that they are never in overlapping locations.

Figure 4C:
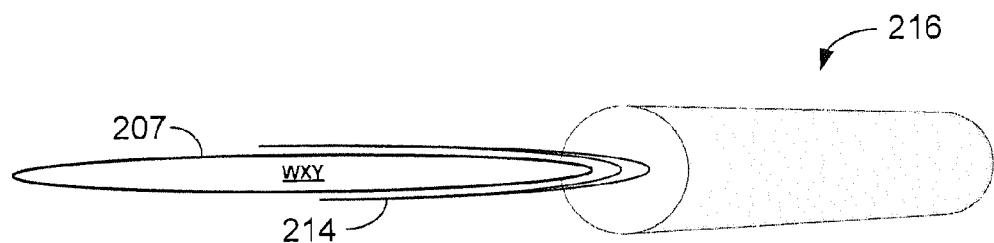

When the gripper 214 is safely in the receiving position, robot arm 206 delivers the workpiece thereto. The workpiece is then captured by the gripper 214 and the robot arm is moved outside a working envelope of the workpiece-laden gripper. This configuration is shown in FIG. 4C, in which a semiconductor wafer 207 (labeled WXY) is shown in gripper 214.

Figure 5:
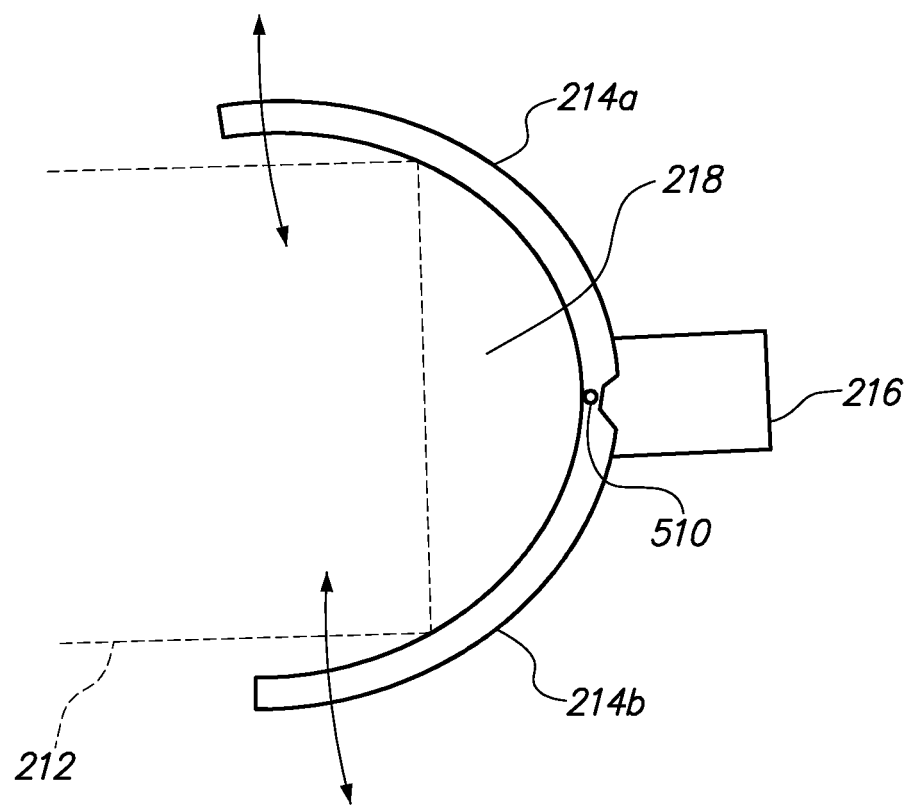
FIG. 5 is a view of the flipping module detailing a gripping motion thereof in accordance with certain embodiments.

Capture of the workpiece can be effected in any of several manners, and can involve a plurality of contact points, or one or more contact surfaces, between the workpiece, and specifically the edges thereof, and the gripper 214. In certain embodiments, mechanical capture can be implemented, as described with reference to FIG. 5. In particular, branches 214a, 214b of gripper 214 are disjoined, with one or both of them being movable by actuator 302b inwardly at pivot point 510 to make contact with the multiple points or surfaces on the edge of the workpiece. In certain embodiments, a single actuator, 302a, can be used for both the flipping (that is, rotating) and gripping motions of gripper 214, with suitable mechanical linkages (not shown) provided for this purpose. In certain embodiments, the capture actuator can take the form of a vacuum mechanism, operable to cause gripping of the workpiece by suction. Also shown in FIG. 5 is a portion of the working envelope 212, which penetrates into an interior region 218 of the gripper 214 but does not overlap surrounding branches 214a, 214b or any portion of the flipping module 216 in the parked position.

Figure 4D:
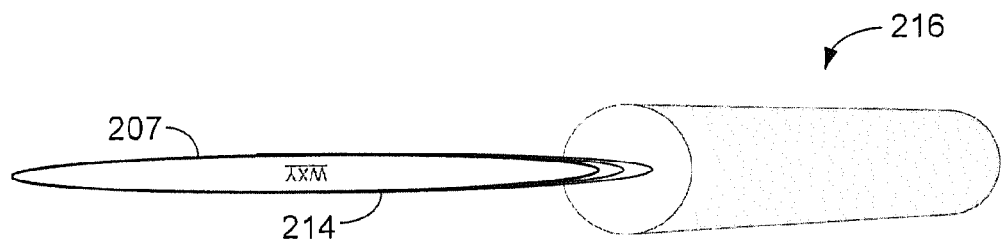

Once the workpiece is securely captured by gripper 214, a flipping operation is commenced. This entails rotating gripper 214 clockwise or counterclockwise 180° (or any other amount if a different orientation of the workpiece is desired). The rotated configuration is shown in FIG. 4D. During rotation, controller 211 can take measures to ensure that no collisions occur, either by parking the robot arm 206 outside a working envelope of the gripper and workpiece during rotation, or by coordinating the motion of the robot arm 206 with the motion of the gripper/workpiece such that they are never in overlapping locations simultaneously.

Figure 4E:
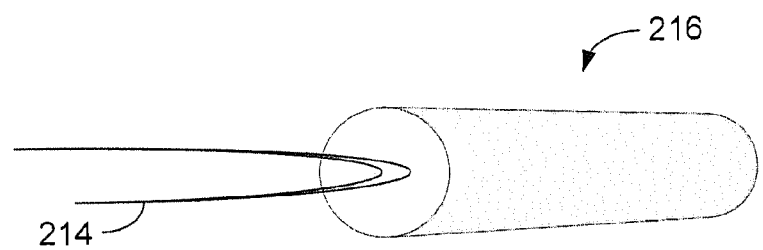

After the workpiece is flipped, a transfer operation is orchestrated, whereby robot arm 206 picks up the workpiece from gripper 214. The gripper 214, after release of the workpiece, is shown in FIG. 4E. The gripper is then rotated 90° back to the parked position of FIG. 4A, and normal robot operation resumes.

Figure 6:
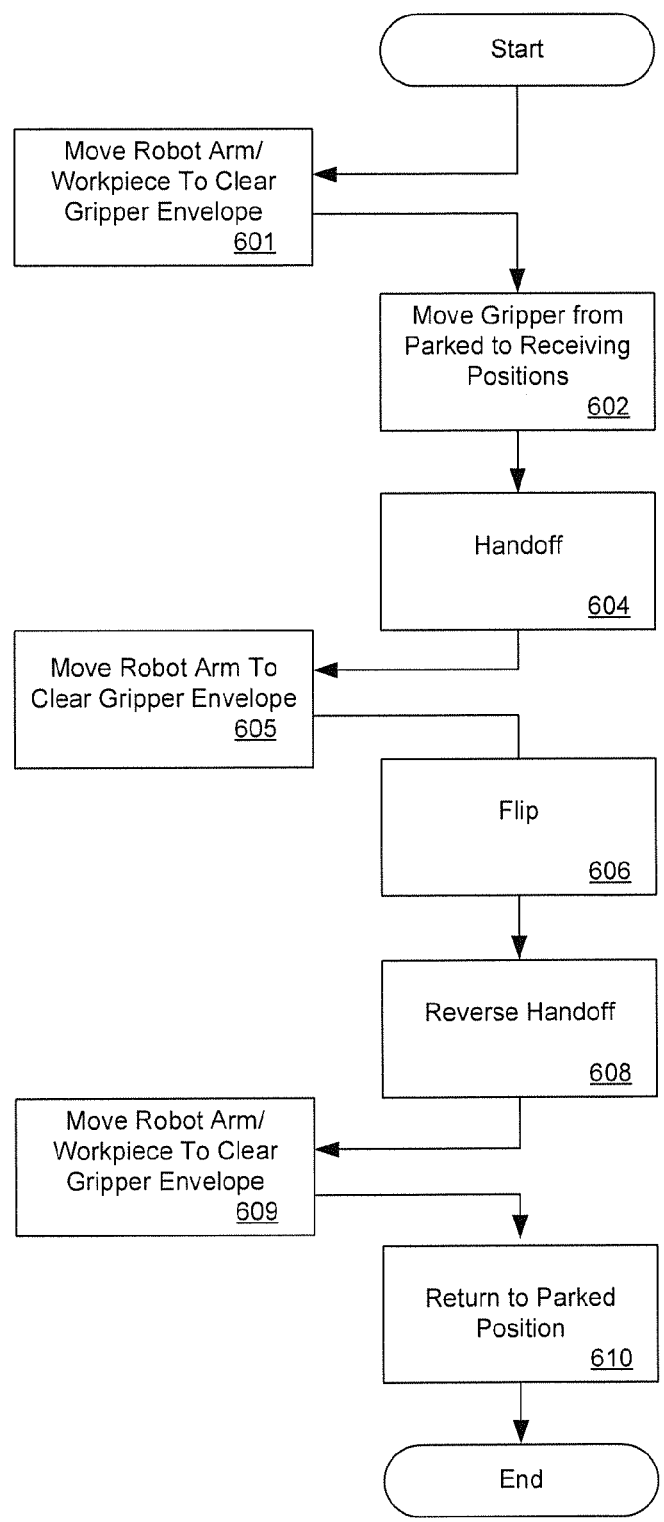
FIG. 6 is a flow diagram of describing procedures associated with a flipping process in accordance with certain embodiments herein.

FIG. 6 is a flow diagram illustrating the procedure for flipping a workpiece in VTC 200 using flipping module 216. At 601, robot arm 206 is moved to clear the gripper 214 working envelope. At 602, gripper 214 is moved from the parked to the receiving positions. Any concurrent motion of the robot arm/workpiece and gripper is coordinated to avoid collisions, and in the extreme case the robot arm is kept entirely out of a working envelope of the gripper. At 604, a handoff from the robot arm 206 to the gripper 214 is conducted. At 605, robot arm 206 is moved to clear the workpiece-laden gripper working envelope. At 606, the workpiece is flipped—that is, the gripper 214 with the workpiece is rotated 180° (or any desired angle). Again, any concurrent motion of the robot arm 206 and gripper/workpiece is coordinated to avoid collisions, and in the extreme case the robot arm is kept entirely out of a working envelope of the gripper. At 608, a reverse handoff is performed, with the robot arm 206 picking up the flipped workpiece from the gripper 214. At 609, the workpiece-laden robot arm is moved to clear the gripper working envelope. At 610, the gripper 214 is returned to the parked position. Again, any concurrent motion of the robot arm/workpiece is coordinated to avoid collisions, and in the extreme case the robot arm/workpiece is kept entirely out of a working envelope of the gripper. Normal robot operation then resumes, with the flipped workpiece. Subsequent flippings can then be performed as needed, in the manner described above.

While embodiments and applications have been shown and described, it would be apparent to those skilled in the art having the benefit of this disclosure that many more modifications than mentioned above are possible without departing from the inventive concepts disclosed herein. The invention, therefore, is not to be restricted except in the spirit of the appended claims.

What is claimed is:

1. A flipping module operable to flip a workpiece delivered by a robot in a vacuum transfer chamber (VTC), the flipping module comprising:
   a gripper disposed outside a working envelope of the robot when the gripper is in a parked position in a vacuum environment of the VTC;
   wherein the gripper and robot are located in said VTC;
   an actuator operable to move the gripper from the parked position to a receiving position, and to rotate the gripper and workpiece to thereby flip the workpiece;
   wherein the actuator is configured for placement outside the vacuum environment of the VTC.

2. The flipping module of claim 1, wherein the receiving position is at least partially in the working envelope of the robot.

3. The flipping module of claim 1, further comprising an additional actuator operable to motivate capture of the workpiece by the gripper.

4. A vacuum transfer chamber (VTC) comprising:
   a wall defining a chamber operable to house a workpiece handling robot in a vacuum environment;
   one or more bays for coupling the vacuum environment to associated processing stations;
   and
   a flipping module including:
   a gripper disposed in the chamber outside a working envelope of the robot in a parked position; and
   an actuator operable to move the gripper from the parked position to a receiving position, and to rotate the gripper and a workpiece captured thereby to thereby flip the workpiece,
   wherein the actuator is configured for placement outside the vacuum environment of the VTC.

5. The VTC of claim 4, wherein the receiving position is at least partially in the working envelope of the robot.

6. The VTC of claim 4, further comprising an additional actuator operable to motivate capture of the workpiece by the gripper.

7. A method for flipping a workpiece in a vacuum environment containing a wafer handling robot whose motions prescribe a working envelope in the vacuum environment, the method comprising:
   moving a gripper from a parked configuration clear of the working envelope to a receiving configuration using a motor disposed outside the vacuum environment;
   delivering the workpiece to the gripper in the receiving configuration;
   rotating the gripper to thereby flip the workpiece using the motor disposed outside the vacuum environment; and
   retrieving the flipped workpiece from the gripper.

8. The method of claim 7, wherein the receiving position is at least partially in the working envelope.

* * * * *